(12) United States Patent
Pentakota et al.

(10) Patent No.: US 6,847,321 B1
(45) Date of Patent: Jan. 25, 2005

(54) CLOSED LOOP AMPLIFICATION WITH HIGH THROUGHPUT PERFORMANCE

(75) Inventors: Visvesvaraya A. Pentakota, Bangalore (IN); Sandeep K. Oswal, Bangalore (IN)

(73) Assignee: Texas Instrument Incorporated, Dallas, TX (US)

( * ) Notice: Subject to any disclaimer, the term of this patent is extended or adjusted under 35 U.S.C. 154(b) by 0 days.

(21) Appl. No.: 10/706,030

(22) Filed: Nov. 13, 2003

(51) Int. Cl.$^7$ ................................. H03M 1/12

(52) U.S. Cl. ...................... 341/156; 341/120

(58) Field of Search ................. 341/156, 120, 341/155, 161, 154, 118, 162

(56) References Cited

U.S. PATENT DOCUMENTS 6,642,871 B2 * 11/2003 Takeyabu et al. ........... 341/120

* cited by examiner

*Primary Examiner*—Brian Young
*Assistant Examiner*—Joseph Lauture
(74) *Attorney, Agent, or Firm*—W. Daniel Swayze, Jr.; W. James Brady; Frederick J. Telecky, Jr.

(57) ABSTRACT

Using an operational amplifier with a low gain in a closed loop amplifier circuit, and correcting for errors (i.e., deviation from the output of an ideal closed loop amplifier using an operational amplifier with infinite gain) that would result from the use of the operational amplifier with low gain. In an embodiment implemented in relation to an analog to digital converter (ADC), a mathematical operation is performed on the digital code(s) generated by the ADC to generate a corrected code corresponding to an analog sample.

19 Claims, 5 Drawing Sheets

CLOSED LOOP AMPLIFICATION WITH HIGH THROUGHPUT PERFORMANCE

BACKGROUND OF THE INVENTION

1. Field of the Invention

The present invention relates to the design of electrical circuits, and more specifically to a method and apparatus for implementing closed amplification with high throughput performance.

2. Related Art

Closed loop amplification is generally implemented by using an operational amplifier with a feedback path connecting the output terminal (of the operational amplifier) to the input terminal as is well known in the relevant arts. Closed loop amplification is used in several environments (e.g., in communication technologies, display technologies) in which an analog signal is to be processed further, as is also well known in the relevant arts.

The operational amplifier is generally implemented with a high gain, as is further well known in the relevant arts. The high gain generally minimizes the deviation (error) from the output of an ideal closed loop amplifier which uses an operational amplifier with infinite gain.

One problem with using operational amplifiers with high gain is that the resulting circuit generally does not operate at high speed (i.e., operates to provide low throughput performance). High speeds are particularly important in environments in which an input signal needs to be processed quickly.

At least for such a reason, it may be desirable to implement closed loop amplification with high throughput performance.

BRIEF DESCRIPTION OF THE DRAWINGS

The present invention will be described with reference to the following accompanying drawings.

In the drawings, like reference numbers generally indicate identical, functionally similar, and/or structurally similar elements. The drawing in which an element first appears is indicated by the left most digit(s) in the corresponding reference number.

DETAILED DESCRIPTION OF THE PREFERRED EMBODIMENTS

1. Overview

An aspect of the present invention provides a correction circuit which corrects for the errors resulting from the use of an operational amplifier with a finite gain in a closed loop amplifier circuit. As may be appreciated, the signal level at the output of the closed loop amplifier circuit would be lower than the signal level at the output of an ideal amplifier with an infinite gain. Accordingly, the correction circuit operates to further amplify (gain more than 1) the output of the operational amplifier with finite gain.

Due to such a correction, an implementation may provide (substantially) the same output as that provided by an ideal closed loop amplifier circuit which uses operational amplifiers with infinite gain.

In one embodiment, the closed loop amplifier circuit is implemented with an operational amplifier having a low gain. Due to the low gain, the amplifier circuit may provide a high throughput performance. However, the proportionately high error resulting due to the low gain, may be corrected using a correction circuit. Thus, an implementation may operate with fairly minimal errors, in addition to providing high throughput performance.

In general, implementation of correction circuits requires that the error be estimated. The manner in which the error can be estimated and the manner in which correction can be performed is described below with several examples.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Estimating Error When Amplification Factor Equals 1

Figure 1:
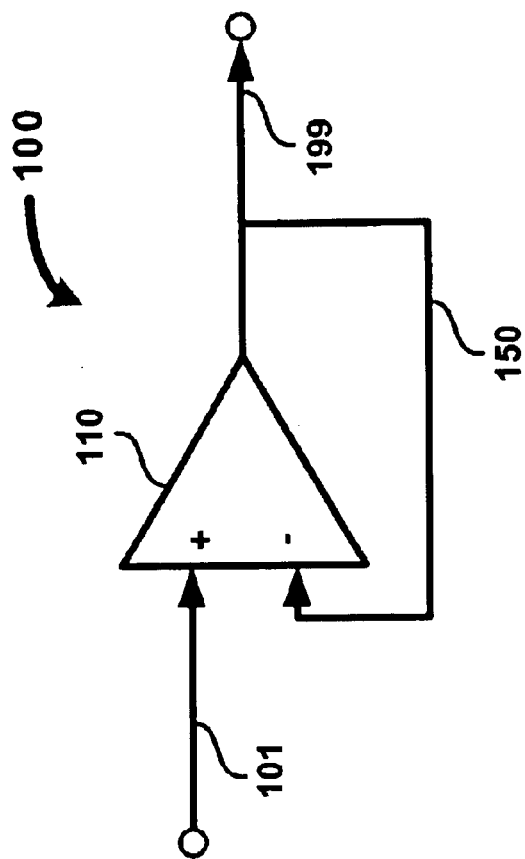
FIG. 1 is a circuit diagram of a closed loop amplifier implemented using a finite gain operational amplifier.

FIG. 1 is a circuit diagram of an example closed loop amplifier circuit used to illustrate the manner in which error may be estimated due to the use of a operational amplifier with finite gain. Closed loop amplifier 100 is shown receiving input signal 101 and generating output signal 199. Closed loop amplifier 100 is shown containing operational amplifier 110, and a feedback path 150.

Assuming that closed loop amplifier 100 is designed to provide an amplification factor of 1, using an operational amplifier 110 with the corresponding finite gain equal to A. An input signal 101 (Vin) is provided as input to closed loop amplifier 100 and an output signal 199 (Vout) is generated by closed loop amplifier 100. The output signal Vout in terms of input (equal to Vin less Vout), and A is as shown in Equation (1) below.

$$Vout=(Vin-Vout) \times A \qquad \text{Equation (1)}$$

wherein '−' and '×' respectively represent subtraction and multiplication operators.

The output signal Vout may be expressed in terms of finite gain A and Vin (by rearranging Equation (1)) and is shown in Equation (2).

$$Vout=Vin \times (A/(1+A)) \qquad \text{Equation (2)}$$

wherein '/' and '+' respectively represents a division and addition operator.

Both the numerator and denominator of Equation (2) is divided by A, and the result is as shown in Equation (3) below.

$$Vout=Vin/(1+(1/A)) \qquad \text{Equation (3)}$$

The resulting factor $1/(1+(1/A))$ in Equation (3) is approximately equal to $(1-(1/A))$ if $(1/A)$ is substantially less than 1. Substituting the approximation in Equation (3), the resulting Equation (4) is shown below.

$$Vout = Vin \times (1-(1/A))$$ Equation (4)

Equation (4) implies that output signal 199 (Vout) is not equal to Vin, but deviates from Vin by some value which is determined as described below. As indicated in Equation (4), Vout may be corrected by dividing the output signal Vout by a factor equal to (1−(1/A)).

The description is continued with reference to computation of the amount of error that is (need to be) corrected by such a division. The deviation (error) is equal to difference of output signal 199 (Vout) from the expected output (as the amplification factor of closed loop amplifier is equal to 1, the output signal 199 is expected to equal Vin), which is as shown in Equation (5) below.

$$Error = Vout - Vin$$ Equation (5)

The error in terms of Vin and operational amplifier gain A may be determined by substituting for Vout (as in Equation (3)) in Equation (5). The resulting expression for error is shown in Equation (6) (the sign of error is not shown as not being necessary for an understanding of the invention).

$$Error = Vin \times (1-(1/A)) - Vin = Vin/A$$ Equation (6)

From Equation (6) it may be appreciated that error may be reduced by increasing the value of A, but increase in the value of A may decrease the throughput performance, and may thus be undesirable as described in a section above.

Accordingly, in an embodiment of the present invention, the error in the output is corrected by a division with (1−(1/A)). As may be appreciated by observing Equation (4), the corrected output would equal the input signal Vin, thereby attaining a gain equal to 1, as desired. A correction circuit to implement the division may be implemented, for example, in digital domain by converting the output of closed loop amplifier 100 into digital values and processing the digital values, as described below with reference to FIG. 5.

While the above analysis is provided with reference to a situation in which the desired amplification factor equals 1, there would be several other situations in which the desired amplification is not equal to 1. Analog to digital converter (ADC) represents an example component where amplification factor greater than 1 may be required as described below in further detail.

3. ADC

Figure 2:
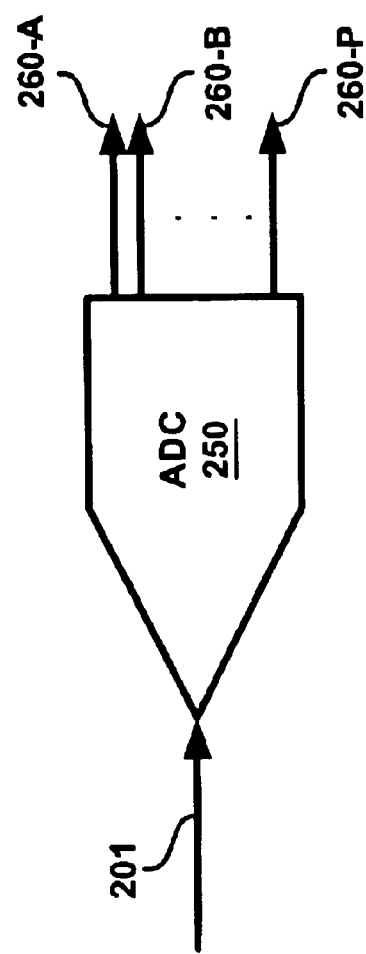
FIG. 2 is a block diagram illustrating the general operation of an analog-to-digital convertor (ADC).

FIG. 2 is a block diagram illustrating the general operation of an analog to digital converter (ADC). ADC 250 is shown receiving an analog signal on path 201, and converts a sample of the analog signal into a P-bit digital code. The P-bits are provided on lines 499-1 through 499-P. In the description below, P is assumed to equal 12 merely for illustration.

ADCs are implemented using multiple stages, particularly as the number of bits (P) generated by the ADC is large, for reasons well known in the relevant arts. An example embodiment containing such multiple stages is described below with reference to FIG. 3.

Figure 3:
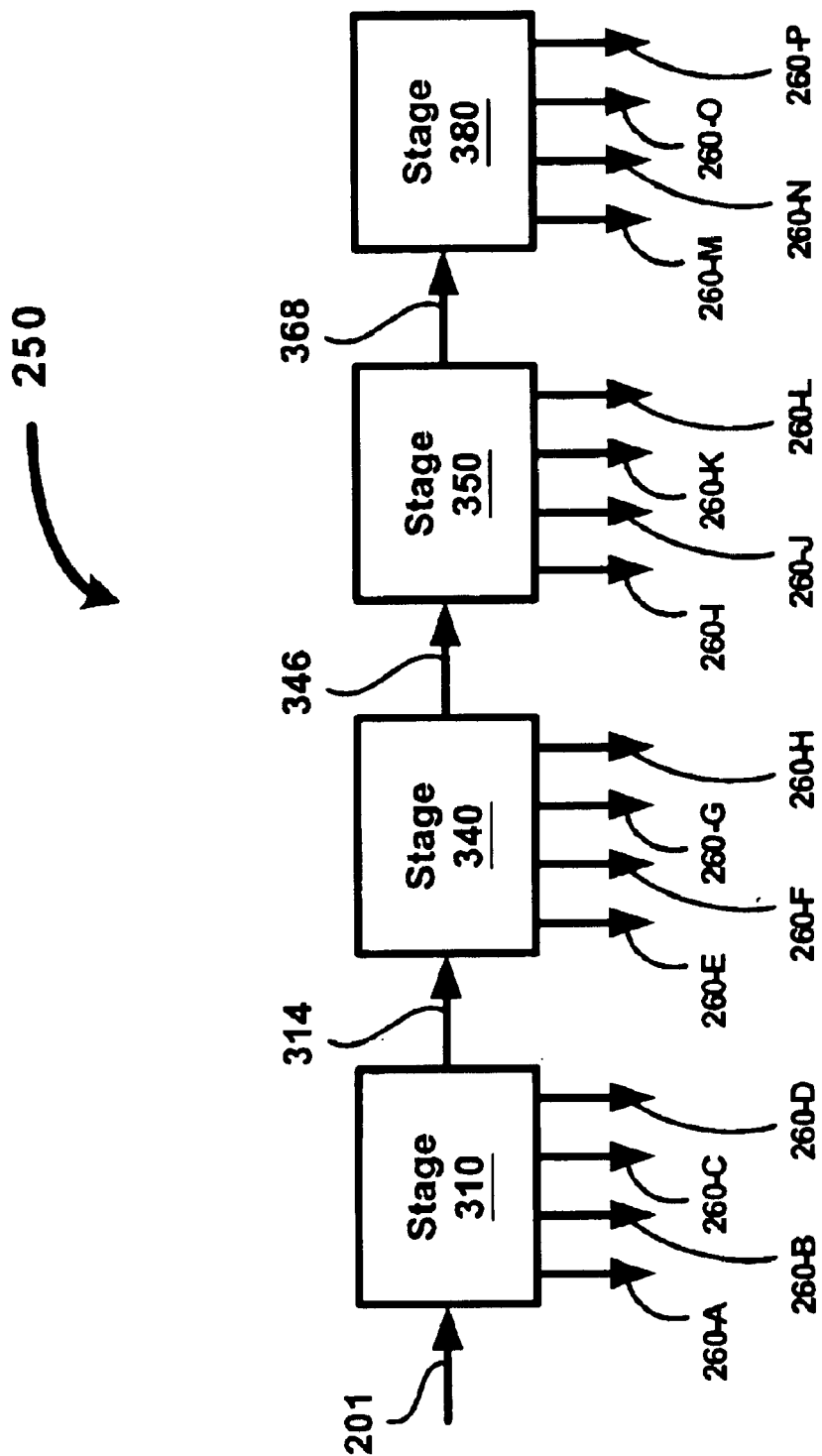
FIG. 3 is a block diagram illustrating the details of various stages used in implementing a pipeline ADC.

FIG. 3 is a block diagram illustrating the details of ADC 250 in one embodiment. ADC 400 is shown containing multiple stages 310, 340, 350 and 380. Each stage generates a sub-code (assuming K-bits each), which together may then be used to generate the P-bit digital code as described below in further detail.

In an embodiment, each K-bit code contains an 'additional bit' for error correction. For example, assuming that P=12, each stage may generate a $4^{th}$ bit code, with the extra 4-bit providing for error correction. In general, the $4^{th}$ bit has a weight of half of the least significant bit of the 3 bits (of the 12 bits) each sub-ADC may need to otherwise generate.

Each stage, except last stage 450, generates an output signal which represents ((Vi−Vdac)×Gain), wherein Vi represents the voltage level of the analog signal, Vdac equals ((sub-code×Vref)/$2^{k-1}$), gain equals $2^{k-1}$, − representing a subtraction operation, and × representing a multiplication operation. The manner in which each stage can be implemented is described below with reference to FIG. 4 in further detail.

4. Stage

Figure 4:
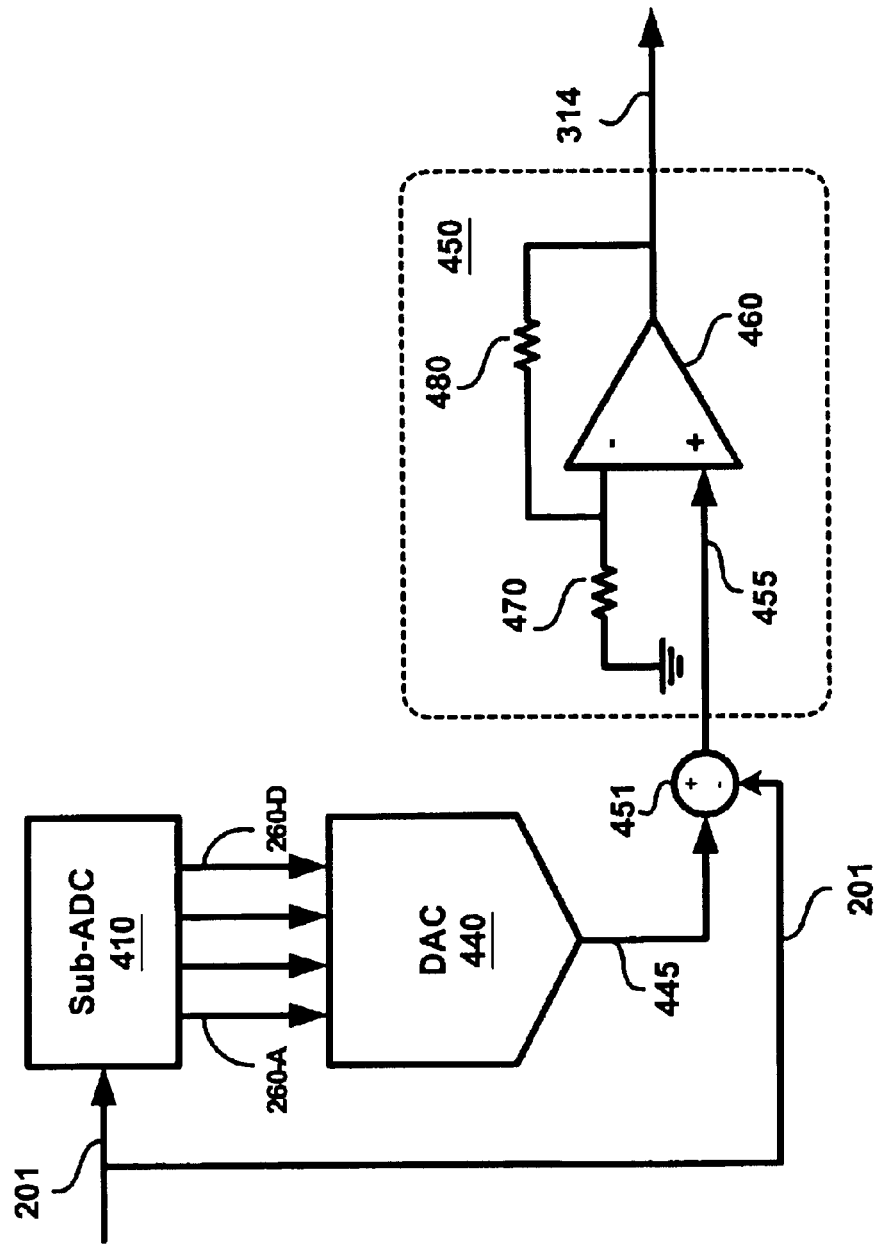
FIG. 4 is a block diagram illustrating the details of the logical view of a stage of an ADC according to an aspect of the present invention.

FIG. 4 is a block diagram illustrating the logical view of implementation details of stage 310 in one embodiment. For illustration, the description is provided with reference to stage 310. The remaining stages (340, 350 and 380) of ADC 250 may also be implemented similarly. Stage 310 is shown containing sub-ADC 410, DAC 440, and closed loop amplifier 450. Each block is described briefly below.

Sub-ADC 410 converts the analog signal received on path 201 into a sub-code containing K bits. For illustration, K is selected to equal 4-bits which are provided on paths 260-A through 260-D. Sub-ADC 410 may be implemented using technologies such as flash ADC, SAR ADC, Sigma-delta ADC, etc, well known in the relevant arts.

DAC 440 converts the sub-code received on paths 260-A through 260-D into corresponding analog signal. Both sub-ADC 410 and DAC 440 may operate using the same reference voltage (not shown). In general, DAC 440 needs to be implemented accurately such that the output generated by DAC 440 accurately represents a portion of the reference voltage corresponding to the sub-code value. DAC 440 also may be implemented in a known way.

Subtractor 451 generates the difference of the analog signal 201 and the analog signal received on path 445. The difference voltage is provided as an input to closed loop amplifier 450 on path 455. In one known embodiment, subtractor 451 and DAC 440 are implemented using capacitors which are charged to the input signal voltage in one phase (sampling phase) of a clock cycle, and amplified using amplifier 550 in another phase (hold phase).

Closed loop amplifier 450 amplifies the output received on path 455 to generate an input for the next stage (i.e, stage 340). The amplification factor needs to equal $2^{K-1}$. The manner in which such amplification can be accurately achieved by using an operational amplifier of low gain is described below in further detail.

5. Closed Loop Amplifier

Closed loop amplifier 450 contains operational amplifier 460 with a finite gain, reference impedance 470, and feedback impedance R480. Analog signal 201 is connected to non-inverting terminal of operational amplifier 460. In the description below, the impedances of 470 and 480 are respectively assumed to equal Z 1 and Z2.

In an embodiment, as in the case of an ideal operational amplifier, the ratio of Z2 to Z1 is selected to equal ($2^{k-1}-1$) and the amplification factor provided by closed loop amplifier 450 equals $2^{K-1}$ represented by (1+(Z2/Z1)). Impedance 470 is conveniently referred to as a reference impedance to differentiate from the feedback impedance. When the reference impedance is provided in the path of the input signal, it may be referred to as an input impedance.

By using low gain for operational amplifier 460, the input signal (provided on path 314) to the next stage can be generated quickly. However, as noted above, the use of low gain introduces an error into the output of close loop amplifier 450. An aspect of the present invention applies a correction to reduce/remove such an error. The manner in which such an error may be estimated is described below with examples.

6. Error Analysis When Amplification Factor is Greater Than 1

For illustration, it is assumed that the output voltage of DAC 440 equals Vdac and the analog signal 201 equals Vin. The error introduced due to use of finite gain operational amplifier in closed loop amplifier 450 may be determined as described below.

The ideal expected output Voexp (assuming an ideal operational amplifier with infinite gain) equals amplification factor times the input to closed loop amplifier 450, which is shown below in Equation (7).

$$Voexp=(Vin-Vdac)\times(1+(Z2/Z1)) \qquad \text{Equation (7)}$$

The ratio of impedance Z2 and Z 1 provides an actual amplification factor of closed loop amplifier 450. For example, the actual amplification factor of 16 may be provided by selecting Z2 equal to 15×Z1 ('x' represents a multiplication operator). The actual output voltage Voactual is as shown in Equation (8) below.

$$Voactual=Voexp/(1+((1+(Z2/Z1))/A)) \qquad \text{Equation (8)}$$

The error caused by the finite gain of the closed loop amplifier equals the deviation of Voactual (of Equation (8)) from expected output (of Equation (7)).

$$Error=Voactual-Voexp=Voexp\ (1+(Z2/Z1))/A \qquad \text{Equation (9)}$$

From Equation (9) it may be appreciated that the error can be corrected by multiplying the generated output by (1+factor), wherein factor equals:

$$Factor=(1/A)(1+(Z2/Z1)) \qquad \text{Equation (10)}$$

Given that the desired amplification factor (F) equals (1+Z2/Z1), factor may be rewritten according to the following equation:

$$Factor=(F/A) \qquad \text{Equation (11A)}$$

In the analysis of above, it is assumed that the gain A remains constant. However, the gain may vary in actual implementations due to the change of various operating conditions. Hypothetically assuming that the gain varies from A1 to A2, the value of the factor may be rewritten as follows:

$$Factor=(1/A1+1/A2)\times(1+Z1/Z2)/2 \qquad \text{Equation (11B)}$$

Using such a fixed value for factor may under-correct or over-correct depending on the actual value of the gain. However, the correction provides more accurate output results according to various aspects of the present invention compared to implementations without correction. It may be further appreciated that the Equation of (11 B) reduces to Equation (11A0 when the amplification factor A does not change.

As noted above, the actual output may be smaller than expected output. The actual output Voactual becomes equal to expected output if the amplification factor is increased as described above. The manner in which the correction can be applied while using a low gain amplifier, is described below using multiple example approaches.

5. Analog Correction

The actual output Voactual at the output of closed loop amplifier 450 (on path 314) needs to be amplified by an additional value as noted above. In an embodiment, the amplification is achieved by changing the value(s) of the impedances 470 (Z1), and/or 480 (Z2). For illustration, assuming that Z1 remains unchanged, the new impedance (Z2new) corresponding to 480 may be computed as shown in Equation (12) below.

$$Z2new=Z2\ (1+Factor). \qquad \text{Equation (12)}$$

wherein factor is defined by Equations (11A and 11B) above.

The ratio of the two resistors Z2new and Z1 is thus given by:

$$Z2new/Z1=(Z2/Z1)\ (1+Factor) \qquad \text{Equation (13A)}$$

Given that (Z2/Z1) equals (Desired Amplification Factor-1), the desired ratio of the two impedances is given by:

$$Z2new/Z1=(F-1)\ (1+Factor) \qquad \text{Equation (13B)}$$

wherein F equals the desired amplification factor for the entire closed loop circuit.

In an illustrative example, in which Vin equals 3.5 volts, Vdac equals 3.40 volts, gain of operational amplifier 460 equals 10,000, amplification factor equals 16 (Z2 equals 15 kilo-ohms and that of Z1 equals 1 kilo-ohms). The value of factor (from Equations 11 A and 11B) equals 0.0016. Assuming that Z2 remains unchanged (i.e., Z2=Z2new=15 kilo-ohms), Z 1 new (using Equation (13)) equals 0.9984 kilo-ohms.

In an embodiment, each of impedances 470 and 480 are implemented in the form of multiple capacitors, which can be selectively enabled/disabled. The capacitors may be connected in parallel, and have potentially different capacitance values. Some of the capacitors (in either or both of 470 and 480) may be selectively enabled/disabled to achieve the desired ration of Z2new/Z 1 (of Equations 13A and 13B, noted above). The circuitry used to enable/disable the capacitors forms part of the correction circuit. The implementation of correction circuit as suited to the specific types of impedances (470 and 480) will be apparent to one skilled in the relevant arts by reading the disclosure provided herein.

Since the amplification of closed loop amplifier circuit equals (1+impedance of 480/impedance of 470), based on Equation 13(A), it may be observed that the amplification is greater (by Factor times) with the correction applied compared to without the correction. The greater amplification compensates for the lower gain that would be caused by using operational amplifier 460 of a finite gain, and thus the output of closed loop amplifier 450 with correction equals that of closed loop amplifier 450 using an ideal operational amplifier as desired.

Thus, by changing the impedances Z1 and/or Z2, the error caused due to finite gain of operational amplifier 460 may be corrected, while maintaining high throughput. In another embodiment, the correction is provided to sub-codes generated by each of the stages as described below with examples.

6. Digital Correction

Figure 5:
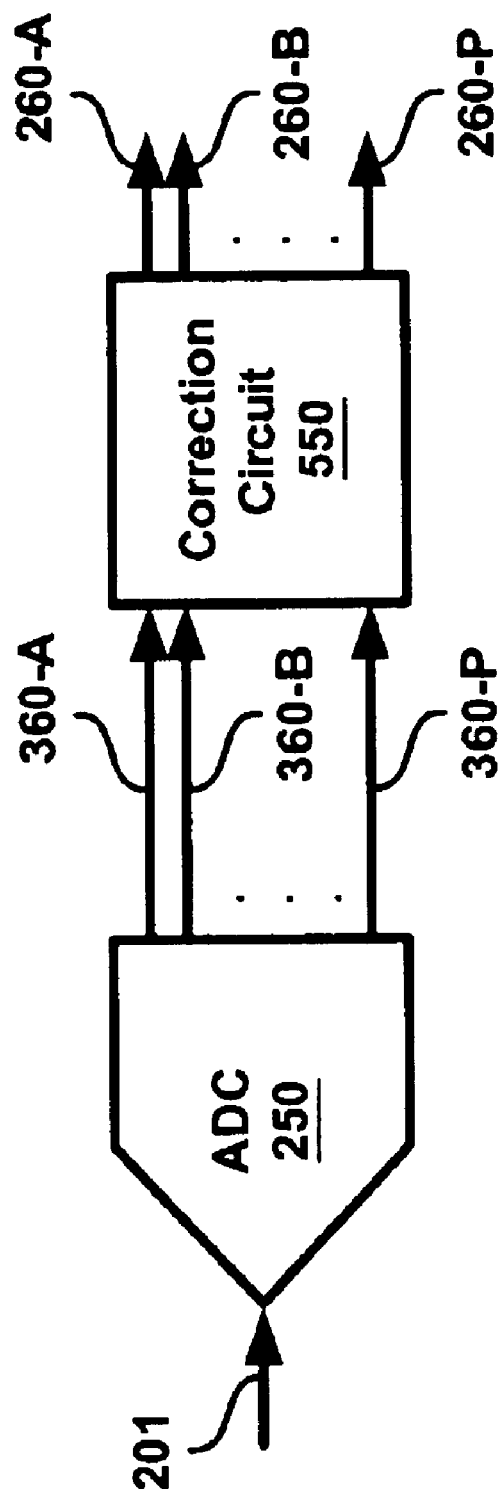
FIG. 5 is a block diagram illustrating the details of an ADC implemented along with a correction circuit operating according to an aspect of the present invention.

FIG. 5 is a block diagram illustrating correction provided to sub-code generated by different stages of ADC 250 of FIG. 2 according to an aspect of the present invention. The block diagram is shown containing ADC 250, and correction circuit 550. Each block as relevant to an aspect of the present invention is described below.

As described in a section above each stage of ADC 250 generates a sub-code containing K bits. Assuming that ADC 250 is implemented using N stages generating P-bit output (each stage resolving K bits of P bits), the output is given by Equation (14) below.

$$\text{Digital code before correction} = (2^{K-1})^{N-1} \times V1 + (2^K)^{N-2} \times V2 + \ldots VN \quad \text{Equation (14)}$$

wherein VI is the value corresponding to K bits (MSB) generated by stage 1, V2 is the value generated by K bits of stage 2, and VN is the value generated by K bits (LSB) of stage N.

Assuming correction is sought to be applied only to the output of the first stage, the desired correction can be attained by computing the digital code as follows.

$$\text{Corrected Code} = (2^{K-1})^{N-1} \times V1 + \{(1+\text{Factor})((2^{K-1})^{N-2} \times V2 + \ldots + VN)\} \quad \text{Equation (15)}$$

wherein Factor is defined above with reference to Equation 10 above.

Equation (15) may be intuitively understood by appreciating that the output of stage 310 is under-amplified (gained up less than) compared to a situation in which an ideal amplifier is used. In other words, without the correction according Equation (15), the sub-codes generated by the later stages would be lower compared to the ideal correct values. The multiplication by (1+Factor) of Equation (15) counters such a lowering effect, and thus the error may be reduced/eliminated.

It may be further appreciated that the overall accuracy is generally more dependent on correction of errors in the earlier stages. Thus, Equation (15) is shown correcting the error in the output of the first stage only. Depending on the desired accuracy, the mathematical operation of Equation 15 can be extended to correct the errors introduced by subsequent stages as well.

Thus, with reference to FIG. 5 again, correction circuit 550 merely needs to perform a mathematical operation (e.g., as in Equation (15)) to correct the error. The sub-codes generated by various stages may be received, and the desired mathematical operations be performed on the sub-codes to correct the error.

Accordingly, a closed loop amplification with high throughput performance may be achieved according to several aspects of the present invention. The description is continued with reference to an example system in which various features of the present invention can be implemented.

7. Example System

Figure 6:
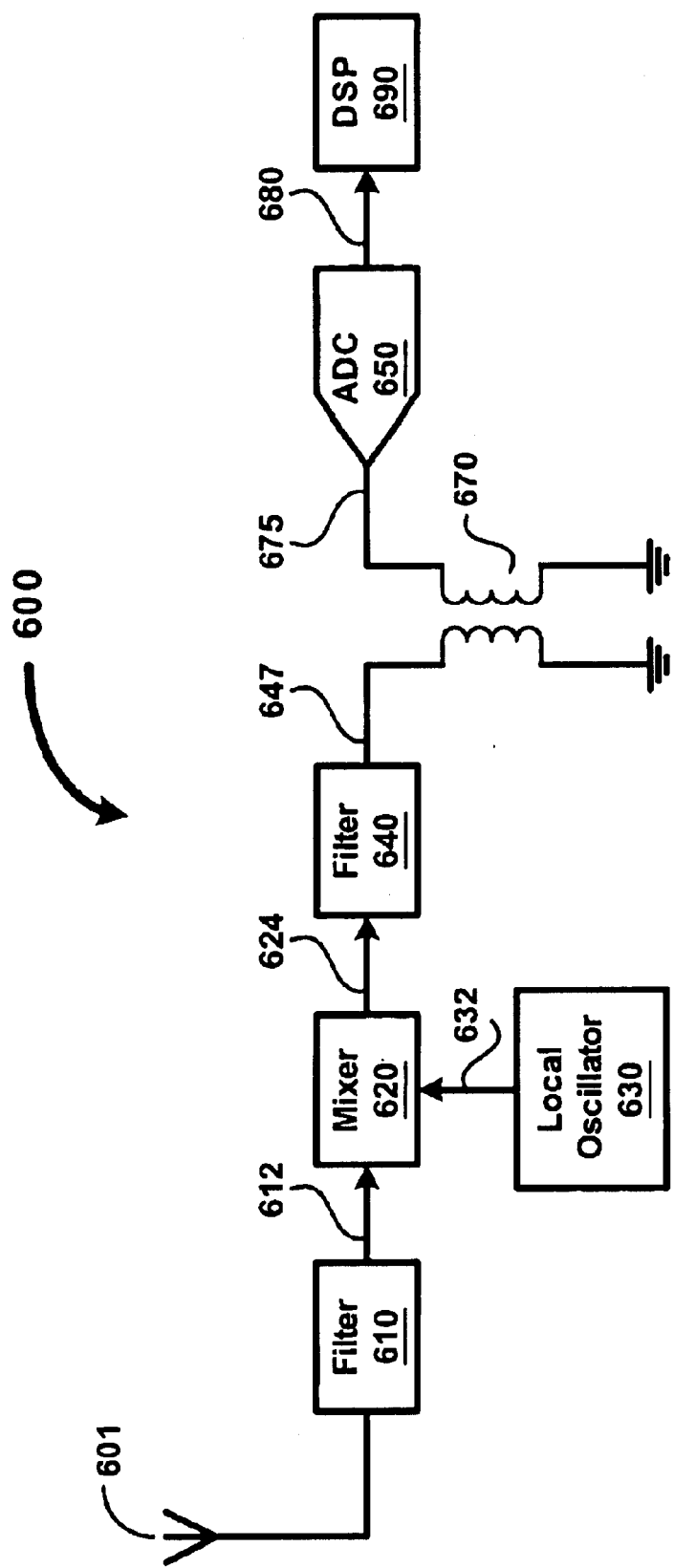
FIG. 6 is a block diagram illustrating an example system in which several aspects of the present invention can be implemented.

FIG. 6 is a block diagram of wireless base station system 600 illustrating an example system in which the present invention may be implemented. For illustration, it is assumed that wireless base station system 600 is implemented to transfer signals corresponding to mobile phone, etc. However, various aspects of the present invention can be implemented in other communication systems (e.g., data processing systems, mobile phones, etc.).

Wireless base station system 600 is shown containing antenna 601, filters 610 and 640, mixer 620, local oscillator 630, analog to digital converter (ADC) 650, transformer 670, transmission line 680, and digital signal processor (DSP) 690. Each component is described in further detail below.

Antenna 601 may receive various signals transmitted from mobile phones, other wireless base stations, etc. The received signals may be provided to filter 610. Filter 610 may perform a corresponding transfer function to generate signals of the frequencies of interest. The generated signals are provided on path 612 to mixer 620.

Local oscillator 630 generates a signal with a fixed frequency and provides the fixed frequency signal on path 632. The signal (on path 632) of fixed frequency may be generated by a phase locked loop, crystal, etc. in a known way.

Mixer 620 may be used to convert a high frequency signal to a signal having a desired frequency. In an embodiment, a signal of frequency 1575 Mlz is converted to a 4 Mhz signal. Mixer 620 receives filtered signal on path 612 and a signal of fixed frequency on path 632 as inputs and provides the signal with a desired frequency on path 624.

Filter 640 filters the signal received on path 624 to remove any noise components that may be present. In general, a mixer generates noise and the output of mixer contains various noise components including the signal with desired frequency. Filter 640 provides the signal with desired frequency only on path 647. Mixer 620, local oscillator 630, and filter 640 may also be implemented in a known way.

Transformer 670 amplifies the signal received on path 647 to generate an amplified signal. The amplified signal may be provided to analog to digital converter (ADC) 650 on path 675.

ADC 650 converts the analog signal received on path 675 to a corresponding digital code using a reference voltage received on path 665. The digital code may be provided to DSP 690 through transmission line 680. ADC 650 may be implemented similar to ADC 250 described above. DSP 690 receives the digital code to provide various user applications (such as telephone calls, data applications).

Thus, various aspects of the present invention described above can be used to provide closed loop amplification with high throughput performance.

8. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An integrated circuit comprising:
   a closed loop amplifier circuit containing an operational amplifier with a finite gain; and
   a correction circuit correcting an error In an output of said closed loop amplifier,
   wherein said correction circuit comprises a feedback impedance and an reference impedance of a first ratio, wherein said first ratio is determined by adjusting a desired amplification factor according to said error.

2. The integrated circuit of claim 1, wherein said closed loop amplifier circuit receives an analog input signal and generates an analog output signal as said output, said integrated circuit further comprising:
   an analog to digital converter (ADC) converting a sample of said analog output signal to an intermediate digital code,
   wherein said correction circuit corrects said error by performing a mathematical operation on said intermediate digital code to generate a corrected digital code representing said output corrected for said error.

3. The integrated circuit of claim 1, wherein said correction circuit divides said output by (1−1/A), wherein A equals said finite gain, to correct said error.

4. An integrated circuit comprising:
   a closed loop amplifier circuit containing an operational amplifier with a finite gain; and a correction circuit correcting an error in an output of said closed loop amplifier, wherein said correction circuit comprises a feedback impedance and an reference impedance of a first ratio, wherein said first ratio is determined by adjusting a desired amplification factor according to said error, and wherein said first ratio equals ((F−1) (1+factor)), wherein F equals the desired amplification factor for said closed loop amplifier circuit and said factor equals ((1/A1+1/A2)×(1+Z1/Z2)/2), wherein said finite gain varies between A1 and A2.

5. An integrated circuit comprising:

a closed loop amplifier circuit containing an operational amplifier with a finite gain; and a correction circuit correcting an error in an output of said closed loop amplifier, wherein said closed loop amplifier circuit receives an analog input signal and generates an analog output signal as said output, said integrated circuit further comprising:

an analog to digital converter (ADC) converting a sample of said analog output signal to an Intermediate digital code, wherein said correction circuit corrects said error by performing a mathematical operation on said intermediate digital code to generate a corrected digital code representing said output corrected for said error, and wherein said intermediate digital code comprises a plurality of sub-codes (V1, V2, . . . Vn) generated by a corresponding plurality of sub-ADCs contained in said ADC, wherein said closed loop amplifier circuit is contained in a first stage generating said V1, said mathematical operation comprises:

multiplying a value formed by (V2, . . . Vn) by (1+Factor), wherein Factor equals (F/A), A equals sad finite gain.

6. An analog to digital converter (ADC) converting a sample of an analog signal to a digital code, said ADC comprising:

a plurality of stages, each of said plurality of stages generating a corresponding one of a plurality of sub-codes, each of said plurality of sub-codes containing at least one bit wherein said sub-codes are used to generate said digital code, at least one of said plurality of stages comprising:

a sub-ADC receiving an input signal and generating a corresponding one of said plurality of sub-codes representing a strength of said input signal;

a digital to analog converter (DAC) converting said corresponding one of said plurality of sub-codes to a corresponding intermediate signal;

an subtractor subtracting a said corresponding intermediate signal from said input signal to generate an subtractor output; and a closed loop amplifier containing an operational amplifier with a finite gain, said closed loop amplifier amplifying said subtractor output to generate said input signal for a next stage; and a correction circuit correcting an error in an output of said closed loop amplifier, wherein said correction circuit comprises a feedback impedance and an reference impedance having impedance of a first ratio, wherein said first ratio is determined by adjusting a desired amplification factor according to said error.

7. The ADC of claim 6, wherein said closed loop amplifier circuit receives an analog input signal and generates an analog output signal as said output, said ADC further comprising:

an analog to digital converter (ADC) converting a sample of said analog output signal to an intermediate digital code, wherein said correction circuit corrects said error by performing a mathematical operation using said intermediate digital code to generate a corrected digital code representing said output corrected for said error.

8. The ADC of claim 7, wherein said intermediate digital code comprises a plurality of sub-codes (V1, V2, . . . Vn) generated by a corresponding plurality of sub-ADCs, wherein said closed loop amplifier circuit is contained in a first stage generating said V1, said mathematical operation comprises:

multiplying a value formed by (V2, . . . Vn) by (1+Factor).

9. The ADC of claim 6, wherein said correction circuit divides said output by (1−1/A), wherein A equals said finite gain, to correct said error.

10. The ADC of claim 6, wherein said sub-ADC comprises a flash ADC.

11. An analog to digital converter (ADC) converting a sample of an analog signal to a digital code, said ADC comprising:

a plurality of stages, each of said plurality of stages generating a corresponding one of a plurality of sub-codes, each of said plurality of sub-codes containing at least one bit, wherein said sub-codes are used to generate said digital code, at least one of said plurality of stages comprising:

a sub-ADC receiving an input signal and generating a corresponding one of said plurality of sub-codes representing a strength of said input signal;

a digital to analog converter (DAC) converting said corresponding one of said plurality of sub-codes to a corresponding intermediate signal;

an subtractor subtracting said corresponding intermediate signal from said input signal to generate an subtractor output; and a closed loop amplifier containing an operational amplifier with a finite gain, said closed loop amplifier amplifying said subtractor output to generate said input signal for a next stage; and a correction circuit correcting an error in an output of said closed loop amplifier, wherein said correction circuit comprises a feedback impedance and an reference impedance having impedance of a first ratio, wherein said first ratio is determined by adjusting a desired amplification factor according to said error, and wherein said first ratio equals ((F−1) (1+factor)), wherein F equals the desired amplification factor for said closed loop amplifier circuit and said factor equals ((1/A1+1/A2)×(1+Z1/Z2)/2), wherein said finite gain varies between A1 and A2.

12. A device comprising:

an analog to digital converter (ADC) converting a sample of an analog signal to a digital code, said ADC comprising:

a plurality of stages, each of said plurality of stages generating a corresponding one of a plurality of sub-codes, each of said plurality of sub-codes containing at least one bit, at least one of said plurality of stages comprising:

a sub-ADC receiving an input signal and generating a corresponding one of said plurality of sub-codes representing a strength of said input signal;

a digital to analog converter (DAC) converting said corresponding one of said plurality of sub-codes to a corresponding intermediate signal;

an subtractor subtracting said corresponding intermediate signal from said input signal to generate an subtractor output; and a closed loop amplifier containing an operational amplifier with a finite gain, said closed loop amplifier amplifying said subtractor output to generate said input signal for a next stage;

a correction circuit correcting an error In an output of said closed loop amplifier, wherein said correction circuit comprises a feedback impedance and an reference impedance having resistance of a first ratio, wherein said first ratio is determined by adjusting a desired amplification factor according to said error.

13. The device of claim 12, wherein said finite gain is low such that said ADC operates to provide a high throughput performance, and wherein said correction circuit reduces said error caused by use of said operational amplifier with low finite gain.

14. The device of claim 12, wherein said finite gain is smaller than at least 6×(N−1) wherein N represents a number of bits contained in said digital code.

15. The device of claim 12, wherein said closed loop amplifier circuit receives an analog input signal and generates an analog output signal as said output, said ADC further comprising:

an analog to digital converter (ADC) converting a sample of said analog output signal to an intermediate digital code, wherein said correction circuit corrects said error by performing a mathematical operation using said intermediate digital code to generate a corrected digital code representing said output corrected for said error.

16. The device of claim 15, wherein said intermediate digital code comprises a plurality of sub-codes (V1, V2 . . . Vn) generated by a corresponding plurality of sub-ADCs, wherein said closed loop amplifier circuit is contained in a first stage generating said V1, said mathematical operation comprises:

multiplying a value formed by (2, . . . Vn) by (1+Factor).

17. The device of claim 12, wherein said correction circuit divides said output by (1−1/A) to correct said error, wherein A equals said finite gain.

18. The device of claim a 12, wherein said device comprises a wireless base station.

19. A device comprising:

an analog to digital converter (ADC) converting a sample of an analog signal to a digital code, said ADC comprising:

a plurality of stages, each of said plurality of stages generating a corresponding one of a plurality of sub-codes, each of said plurality of sub-codes containing at least one bit, at least one of said plurality of stages comprising:

a sub-ADC receiving an input signal and generating a corresponding one of said plurality of sub-codes representing a strength of said input signal;

a digital to analog converter (DAC) converting said corresponding one of said plurality of sub-codes to a corresponding intermediate signal;

an subtractor subtracting said corresponding intermediate signal from said input signal to generate an subtractor output; and a closed loop amplifier containing an operational amplifier with a finite gain, said closed loop amplifier amplifying said subtractor output to generate said input signal for a next stage;

a correction circuit correcting an error in an output of said closed loop amplifier, wherein said correction circuit comprises a feedback impedance and an reference impedance having resistance of a first ratio, wherein said first ratio is determined by adjusting a desired amplification factor according to said error, and wherein said first ratio equals ((F−1) (1+factor)), wherein F equals the desired amplification factor for said closed loop amplifier circuit and said factor equals ((1/A1+1 A2)×(1+Z1/Z2)/2), wherein said finite gain varies between A1 and A2.

* * * * *